United States Patent
Yu et al.

(10) Patent No.: US 6,975,000 B2
(45) Date of Patent: Dec. 13, 2005

(54) METHOD OF FORMING A RECESSED BURIED-DIFFUSION DEVICE

(75) Inventors: Chiu-Hung Yu, Kaohsiung (TW); Yang Chung-Heng, Hsin-Chu (TW); Wu Lin-June, Hsin-Chiu (TW)

(73) Assignee: Taiwan Semiconductor Manufacturing Company, (TW)

( * ) Notice: Subject to any disclaimer, the term of this patent is extended or adjusted under 35 U.S.C. 154(b) by 1 day.

(21) Appl. No.: 10/820,390

(22) Filed: Apr. 8, 2004

(65) Prior Publication Data

US 2005/0224873 A1    Oct. 13, 2005

(51) Int. Cl.⁷ .......................... H01L 29/76; H01L 29/94; H01L 31/062; H01L 31/113; H01L 31/119

(52) U.S. Cl. ...................................... 257/344; 257/408

(58) Field of Search ............................. 257/336, 344, 257/408

(56) References Cited

U.S. PATENT DOCUMENTS

| 5,734,185 | A  | * | 3/1998  | Iguchi et al. ............... 257/336 |
| 6,025,235 | A  | * | 2/2000  | Krivokapic ................ 438/289 |
| 6,498,067 | B1 |   | 12/2002 | Perng et al. ................ 438/305 |
| 6,563,176 | B2 | * | 5/2003  | Gauthier et al. ............ 257/360 |
| 2003/0030114 | A1 | * | 2/2003 | Kuwazawa ................. 257/408 |
| 2005/0035408 | A1 | * | 2/2005 | Wang et al. ................ 257/344 |

* cited by examiner

Primary Examiner—Ngân V. Ngô

(57) ABSTRACT

A method of forming a device (and the device so formed) comprising the following steps. A structure having a gate structure formed thereover is provided. Respective low doped drains are formed within the structure at least adjacent to the gate structure. A pocket implant is formed within the structure. The structure adjacent the gate structure is etched to form respective trenches having exposed side walls. Respective first liner structures are formed at least over the exposed side walls of trenches. Respective second liner structures are formed over the first liner structures. Source/drain implants are formed adjacent to, and outboard of, second liner structures to complete formation of device.

13 Claims, 3 Drawing Sheets

METHOD OF FORMING A RECESSED BURIED-DIFFUSION DEVICE

FIELD OF THE INVENTION

The present invention relates generally to semiconductor devices and more specifically to MOSFET gate devices.

BACKGROUND OF THE INVENTION

Prior devices employ a silicon nitride (SiN) spacer with a Co salicide scheme however this leads to high sheet resistance due to design rule limitation.

U.S. Pat. No. 6,498,067 B1 to Perng et al. describes a process for forming a composite insulator spacer on the sides of a MOSFET gate structure.

SUMMARY OF THE INVENTION

Accordingly, it is an object of one or more embodiments of the present invention to provide a method of forming a MOSFET gate device having a recess buried diffusion and the device so formed.

Other objects will appear hereinafter.

It has now been discovered that the above and other objects of the present invention may be accomplished in the following manner. Specifically, a structure having a gate structure formed thereover is provided. Respective low doped drains are formed within the structure at least adjacent to the gate structure. A pocket implant is formed within the structure. The structure adjacent the gate structure is etched to form respective trenches having exposed side walls. Respective first liner structures are formed at least over the exposed side walls of trenches. Respective second liner structures are formed over the first liner structures. Source/drain implants are formed adjacent to, and outboard of, second liner structures to complete formation of device.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
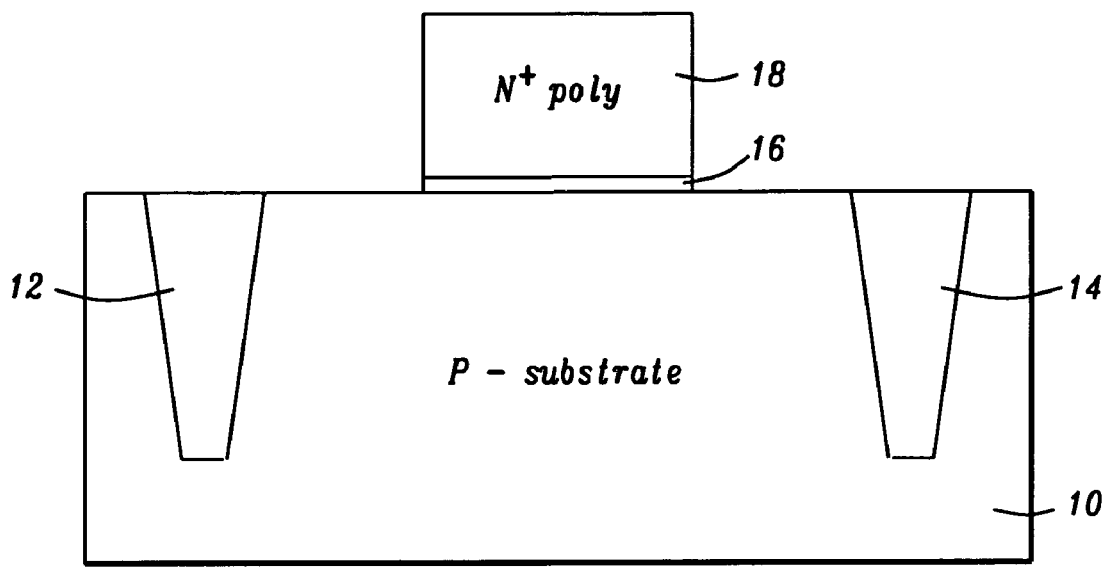
FIGS. 1 to 6 schematically illustrates a preferred embodiment of the present invention.

Initial Structure—FIG. 1

As shown in FIG. 1, structure 10 includes a gate structure 18 with underlying gate oxide layer 16 with isolation structures 12, 14 on either side of the gate structure 18.

Structure 10 is preferably a silicon or germanium substrate and is more preferably a P⁻ silicon semiconductor substrate as shown in FIG. 1.

Gate structure 18 is preferably comprised of N⁺ polysilicon (N⁺ poly), polysilicon (poly) or tungsten silicide (WSi$_x$) and is more preferably N⁺ poly as shown in FIG. 1. Gate structure 18 has a thickness of preferably from about 1000 to 3000 Å and more preferably from about 1500 to 2500 Å. Poly gate structure 18 is preferably formed by: poly deposition; poly lithography and poly etching.

Underlying gate oxide layer (GOX) 16 is preferably silicon oxide and has a thickness of preferably from about 15 to 80 Å and more preferably from about 45 to 75 Å.

Isolation structures 12, 14 are preferably shallow trench isolation structures (STIs) and are preferably comprised of oxide, silicon oxide or HDP oxide and are more preferably oxide.

Figure 2:
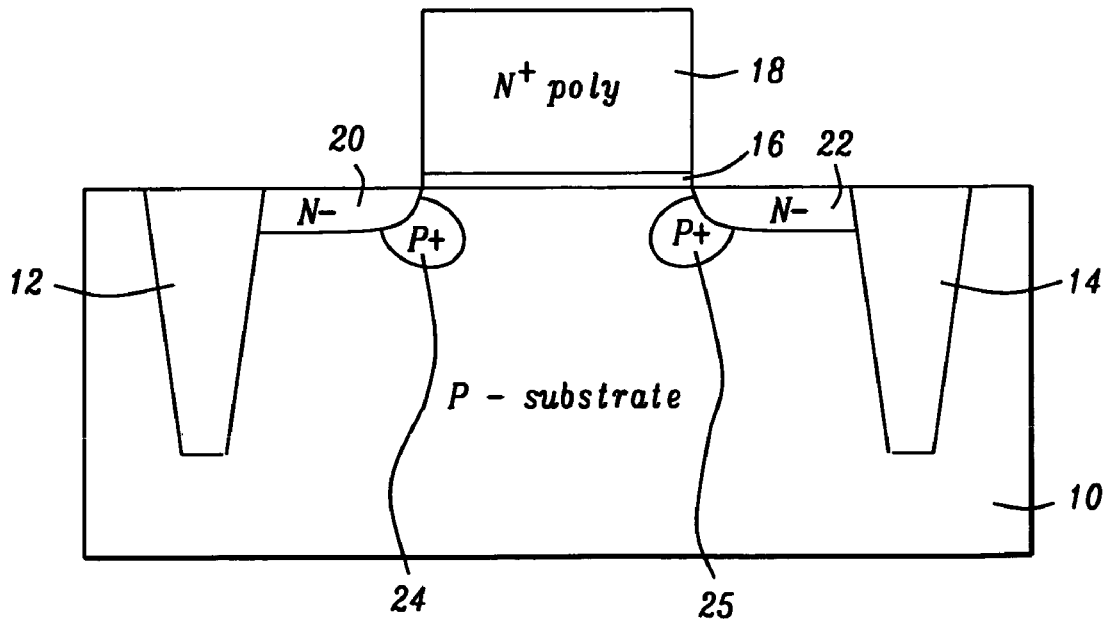

Formation of LDDs 20, 22 and Pocket Implants 24, 25—FIG. 2

As shown in FIG. 2, low doped drains (LDDs) 20, 22 are formed within substrate 10 adjacent gate structure 18 to a depth of preferably from about 100 to 500 Å and more preferably from about 150 to 300 Å. LDDs 20, 22 are preferably formed using a tilt implant process so they 'undercut' gate structure 18 by preferably from about 100 to 250 Å and more preferably from about 120 to 200 Å from the respective edges of gate structure 18.

While LDDs 20, 22 are illustrated as being N⁻, LDDs 20, 22 may be either N⁻ or P⁻.

The tilt implant process is conducted at an angle of preferably from about 15 to 75° and more preferably from about 30 to 60°.

Pocket implants 24, 25 is also formed within substrate 10 to a depth of preferably from about 200 to 400 Å and more preferably from about 250 to 350 Å. Pocket implants 24, 25 are preferably P+ pocket implants for NMOS and are formed to prevent device punch-through.

Figure 3:
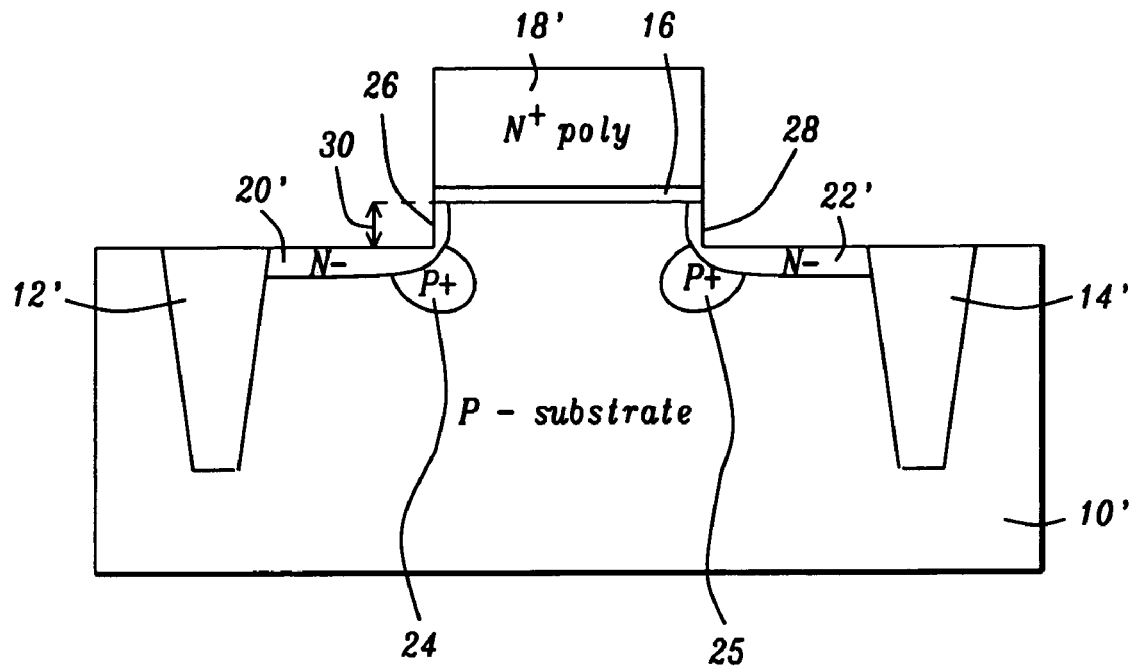

Self-Aligned Trench 26, 28 Etch and First Rapid Thermal Anneal—FIG. 3

As shown in FIG. 3, self-aligned trenches 26, 28 are etched into substrate 10/LDDs 20, 22STIs adjacent gate structure 18 and STIs 12, 14. This etching process also thins gate structure 18 and STIs 12, 14 to form: thinned gate structure 18' having a thickness of preferably from about 800 to 2800 Å and more preferably from about 1300 to 2300 Å; and etched STIs 12', 14'.

Trenches 26, 28 are recessed as at 30 by preferably from about 50 to 200 Å and more preferably from about 70 to 130 Å beneath GOX 16.

This leaves remaining LDDs 20', 22' as shown in FIG. 3.

An optional first rapid thermal anneal (RTA) may then be performed, either before or after formation of self-aligned trenches 26, 28 at a temperature of preferably from about 800 to 1000° C. and more preferably from about 850 to 950° C. for preferably about 3 seconds and more preferably about 2 seconds.

Figure 4:
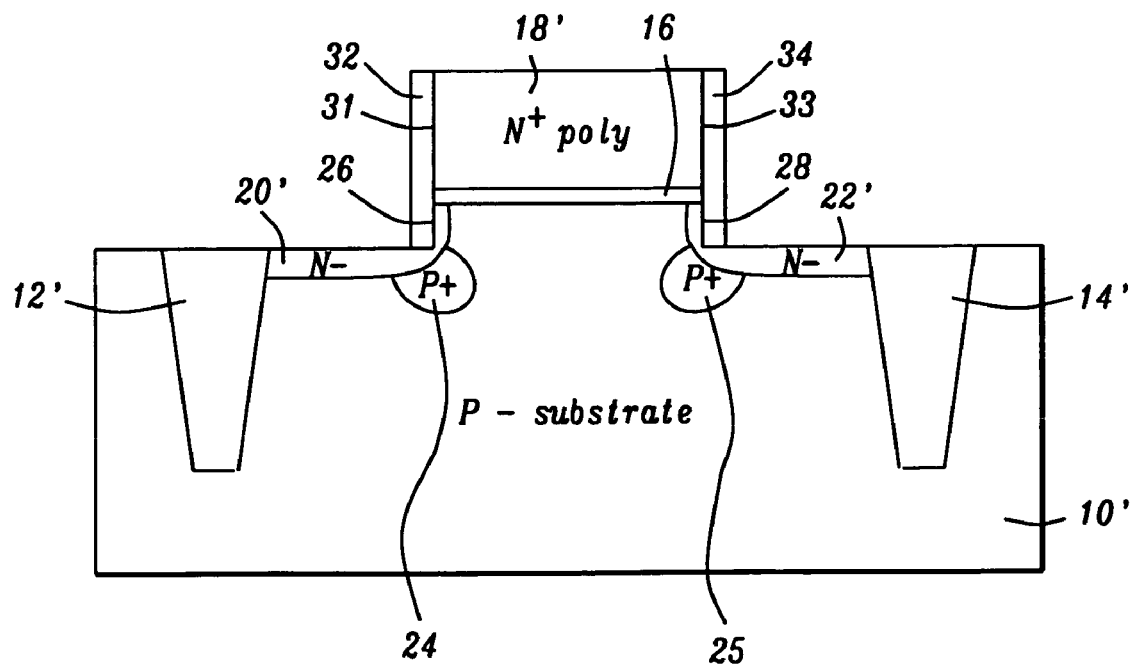

Formation of Liner TEOS Structures 32, 34—FIG. 4

As shown in FIG. 4, a layer of TEOS is formed over the structure of FIG. 4 and is then etched back to form liner TEOS structures 32, 34 over the exposed side walls 31, 33 of thinned gate structure 18', GOX 16 and trenches 26, 28. Due to the conformal deposition of the TEOS layer and subsequent etch back, TEOS structures 32, 34 are formed only on the exposed side walls 31, 33 of thinned gate structure 18' et al.

Liner TEOS structures 32, 34 have a thickness of preferably from about 100 to 500 Å and more preferably from about 150 to 300 Å.

Liner TEOS structures 32, 34 serve as buffer layers to relieve stress between poly gate 18' and the subsequently formed silicon nitride spacers 36, 38 as described below.

Figure 5:
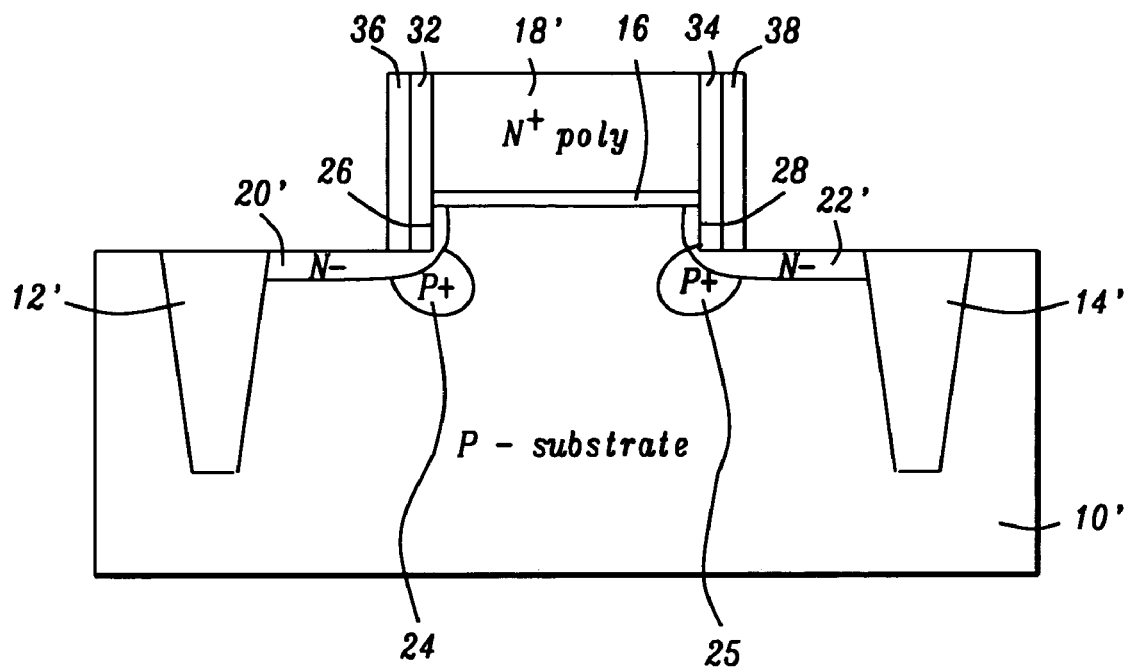

Formation of Liner SiN Structures 36, 38—FIG. 5

As shown in FIG. 5, a layer of silicon nitride (Si$_3$N$_4$ or SiN) is formed over the structure of FIG. 4 and is then etched back to form liner SiN structures 36, 38 over respective liner TEOS structures 32, 34. Due to the conformal deposition of the SiN layer and subsequent etch back, SiN structures 32, 34 are formed only on the TEOS structures 32, 34.

Liner SiN structures 36, 38 have a thickness of preferably from about 300 to 2500 Å and more preferably from about 500 to 1500 Å.

Liner SiN structures 36, 38 serve as spacers and may retard E-field and increase breakdown voltage.

Formation of Source/Drain Implants 40, 42. Second Rapid Thermal Anneal And Salicide Structures 44, 46, 48—FIG. 6

Figure 6:
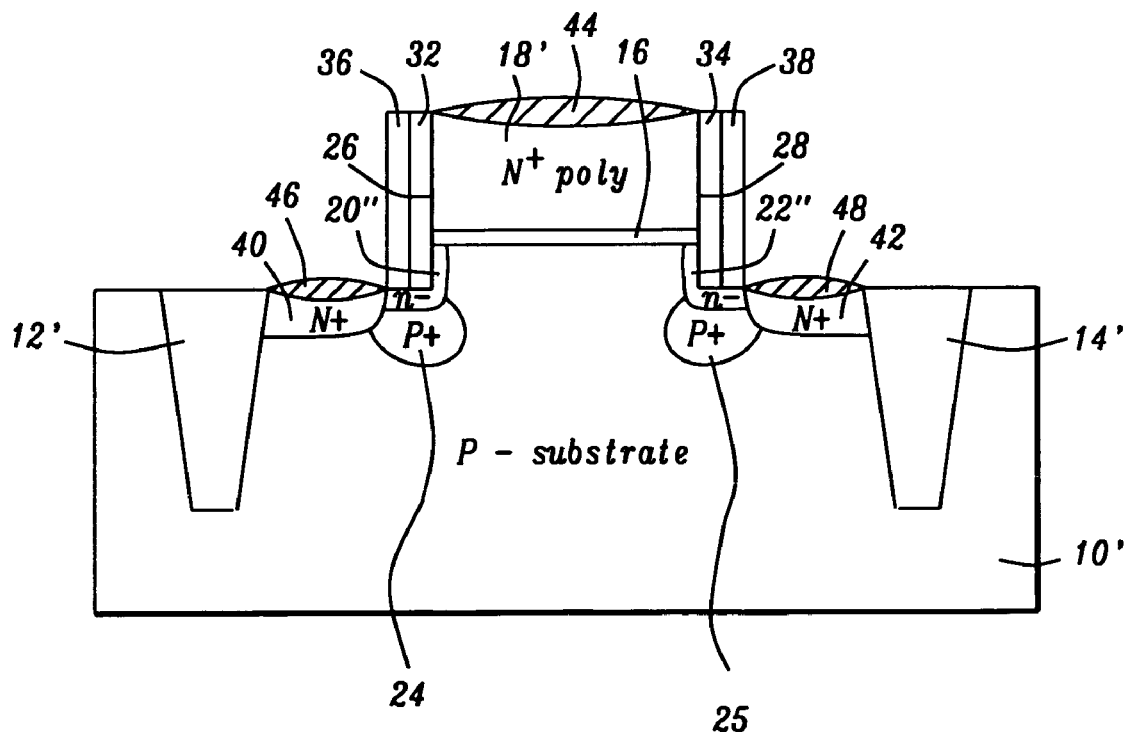

As shown in FIG. 6, respective source/drain implants 40, 42 are formed within substrate 10 adjacent and outboard of liner SiN structures 36, 38 to a depth of preferably from about 300 to 3000 Å and more preferably from about 300 to 2500 Å.

Source/drain implants 40, 42 are preferably $N^+$ implants for NMOS.

This leaves final remaining LDDs 20", 22" as shown in FIG. 6.

A (second) rapid thermal anneal (RTA) is also performed after formation of source/drain implants 40, 42 at a temperature of preferably from about 1000 to 1100° C. and more preferably from about 1010 to 1090° C. for preferably from about 5 to 30 seconds and more preferably from about 7 to 20 seconds.

Respective metal salicide structures 44; 46, 48 are then formed over: thinned gate structure 18'; and source/drain implants 40, 42 to a thickness of preferably from about 50 to 300 Å and more preferably from about 100 to 200 Å. Metal salicide structures 44; 46, 48 are preferably cobalt salicide ($CoSi_x$), nickel salicide ($NiSi_x$) or titanium silicide ($TiSi_x$) and are more preferably cobalt salicide ($CoSi_x$) or nickel salicide ($NiSi_x$).

This completes the formation of the recessed buried-diffusion device 50.

Advantages of the Present Invention

The advantages of one or more embodiments of the present invention include:
1. reduction of RSBD (buried diffusion for drain side) and RSBS (buried diffusion for source side):
   a. increase effective diffusion area due to minimized spacer by recess process; and
   b. helpful for window design rule, high density approach;
2. increase gate added breakdown
   a. avoid gate-induced drain leakage (GIDL) (band to band) due to source/drain being far away from the gate edge; and
   b. higher voltage (HV) device is applied as LCD TV driver due to BVDj (junction breakdown)—can achieve>20V;
3. potential reliability
   a. better gate oxide integrity (GOI) performance due to good gate oxide protection;
   b. avoid hot carrier effect; and
   c. good capability of spacer width uniformity control;
4. formation of a high voltage device and product; and
5. excellent reliability performance.

While particular embodiments of the present invention have been illustrated and described, it is not intended to limit the invention, except as defined by the following claims.

We claim:

1. A device structure, comprising:
   a substrate;
   a gate structure over the substrate;
   respective low doped drains within the substrate at least adjacent to the gate structure;
   pocket implants within the substrate;
   respective trenches having exposed side walls adjacent gate structure;
   respective first liner structures at least over the exposed side walls of trenches;
   respective second liner structures over the first liner structures; and
   source/drain implants adjacent to, and outboard of, second liner structures.

2. The structure of claim 1, wherein the substrate is comprised of silicon or germanium.

3. The structure of claim 1, wherein the substrate is a $P^-$ semiconductor substrate.

4. The structure of claim 1, wherein the substrate is a $P^-$ substrate; the gate structure is an $N^+$ gate structure; the low doped drains are $N^-$ low doped drains; the pocket implants are $P^+$ pocket implants; and the source/drain implants are $N^+$ source/drain implants.

5. The structure of claim 1, wherein the gate structure of comprised of $N^+$ polysilicon, polysilicon or tungsten silicide; the first liner structures are comprised of TEOS; and the second liner structures are comprised of silicon nitride.

6. The structure of claim 1, wherein the gate structure is comprised of $N^+$ polysilicon; the first liner structures are comprised of TEOS; and the second liner structures are comprised of silicon nitride.

7. The structure of claim 1, including respective metal salicide structures over:
   the gate structure; and
   the source/drain implants.

8. The structure of claim 1, including respective cobalt salicide, nickel salicide or titanium salicide structures over:
   the gate structure; and
   the source/drain implants.

9. The structure of claim 1, including respective cobalt salicide or nickel salicide structures over:
   the gate structure; and
   the source/drain implants.

10. The structure of claim 1, including respective isolation structures within the substrate proximate the gate structure.

11. The structure of claim 1, including a gate oxide layer between the gate structure and the substrate.

12. The structure of claim 1, wherein the gate structure has a thickness of from about 1000 to 3000 Å, the first liner structures have a thickness of from about 100 to 500 Å and the second liner structures have a thickness of from about 300 to 2500 Å.

13. The structure of claim 1, wherein the gate structure has a thickness of from about 1500 to 3000 Å, the first liner structures have a thickness of from about 150 to 300 Å and the second liner structures have a thickness of from about 500 to 1500 Å.

* * * * *